(12) United States Patent
Sumita (10) Patent No.: US 7,541,651 B2
(45) Date of Patent: Jun. 2, 2009

(54) SEMICONDUCTOR INTEGRATED CIRCUIT (75) Inventor: Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 4 days.

(21) Appl. No.: 11/497,514

(22) Filed: Aug. 2, 2006

(65) Prior Publication Data
US 2007/0085146 A1  Apr. 19, 2007

(30) Foreign Application Priority Data
Aug. 2, 2005 (JP) ............... 2005-224247

(51) Int. Cl.
H01L 23/50 (2006.01)
(52) U.S. Cl. .................................... 257/371
(58) Field of Classification Search ............ None
See application file for complete search history.

(56) References Cited

U.S. PATENT DOCUMENTS

| 5,610,550 | A  | * | 3/1997  | Furutani ............. 327/543 |
| 6,064,097 | A  |   | 5/2000  | Hiraga |
| 6,306,709 | B1 | * | 10/2001 | Miyagi et al. ........ 438/276 |
| 6,600,305 | B2 | * | 7/2003  | Andoh et al. ........ 323/315 |
| 6,648,821 | B2 | * | 11/2003 | Lebel et al. ......... 600/300 |
| 7,009,246 | B2 | * | 3/2006  | Kawata et al. ....... 257/327 |
| 2004/0227183 | A1 | * | 11/2004 | Negoro et al. ........ 257/338 |

OTHER PUBLICATIONS

Tadahiro Kuroda et al., "A High-Speed Low-Power 0.3 µm CMOS Gate Array with Variable Threshold Voltage (VT) Scheme," IEEE 1996 Custom Integrated Circuits Conference, p. 53-56.
Masaya Sumita et al., "Mixed Body-Bias Techniques with Fixed $V_t$ and $I_{ds}$ Generation Circuits," ISSCC 2004 / Session 8 / Circuits for Digital Systems / 8.5, 2004 IEEE International Solid-State Circuits Conference.

* cited by examiner

Primary Examiner—Sue A. Purvis
Assistant Examiner—Fei Fei Yeung Lopez
(74) Attorney, Agent, or Firm—McDermott Will & Emery LLP (57) ABSTRACT A semiconductor integrated circuit has a first substrate of a first polarity to which a first substrate potential is given, a second substrate of the first polarity to which a second substrate potential different from the first substrate potential is given, and a third substrate of a second polarity different from the first polarity. The first substrate is insulated from a power source or ground to which a source of a MOSFET formed on the substrate is connected. The third substrate is disposed between the first and second substrates in adjacent relation to the first and second substrates. A circuit element is formed on the third substrate.

29 Claims, 8 Drawing Sheets

NWELL2 is Absent (without Guard)

FIG. 6B

NWELL2 is Present (with Guard)

SEMICONDUCTOR INTEGRATED CIRCUIT

CROSS REFERENCE TO RELATED APPLICATIONS

The teachings of Japanese Patent Application JP 2005-224247, filed Aug. 2, 2005, are entirely incorporated herein by reference, inclusive of the specification, drawings, and claims.

BACKGROUND OF THE INVENTION

1. Field of the Invention

The present invention relates to a semiconductor integrated circuit comprising at least two independent substrates of the same one polarity and at least one substrate of another different polarity and, more particularly, to a technology for reductions in area and power consumption.

2. Description of the Prior Art

In a semiconductor integrated circuit, the substrate potential of a MOS element (MOS transistor) is used occasionally under control. This is because, by changing the substrate potential of the MOS element, an advantageous feature is provided that the threshold and saturation current characteristic of the MOS element can be varied. As an example of making use of the advantageous feature, there is a method which allows the threshold and saturation current characteristic to be varied when the semiconductor integrated circuit is operating and when it comes to a halt. Specifically, there is a method which reduces the difference between the substrate potential of the MOS element and the source potential thereof to 0 when the semiconductor integrated circuit is operating and increases the difference therebetween when the semiconductor integrated circuit comes to a halt, thereby increasing the threshold of the MOS to a level higher than during operation, reducing a sub-threshold leakage current in the MOS element, and achieving lower power consumption. There is also a method which performs variable control of the substrate potential to keep uniform the fluctuations of MOS characteristics due to variations in ambient temperature and internal voltage or variations in fabrication process and maintain circuit performance. To implement the control of the substrate potential of the MOS element described above, a layout method which provides the semiconductor integrated circuit with a higher area efficiency has been proposed (T. Kuroda et. al., "A High-Speed Low-Power 0.3 µm CMOS Gate Array with Variable Threshold Voltage Scheme," IEEE Custom Integrated Circuit Conference 1996 pp. 53-56).

In the 0.5-µm to 0.3-µm generation in which the above-mentioned technology was proposed, not only a power source voltage but also the threshold voltage of the MOS element followed an ideal scaling rule for a CMOS process with the increasing miniaturization of the process. However, in the recent 0.13-µm to 90-nm generation, a situation has been encountered in which the power source voltage and the threshold voltage of a MOS element cannot follow the ideal scaling rule for the process. That is, even when process scaling is performed, the power source voltage and the threshold voltage remain constant.

Figure 7:
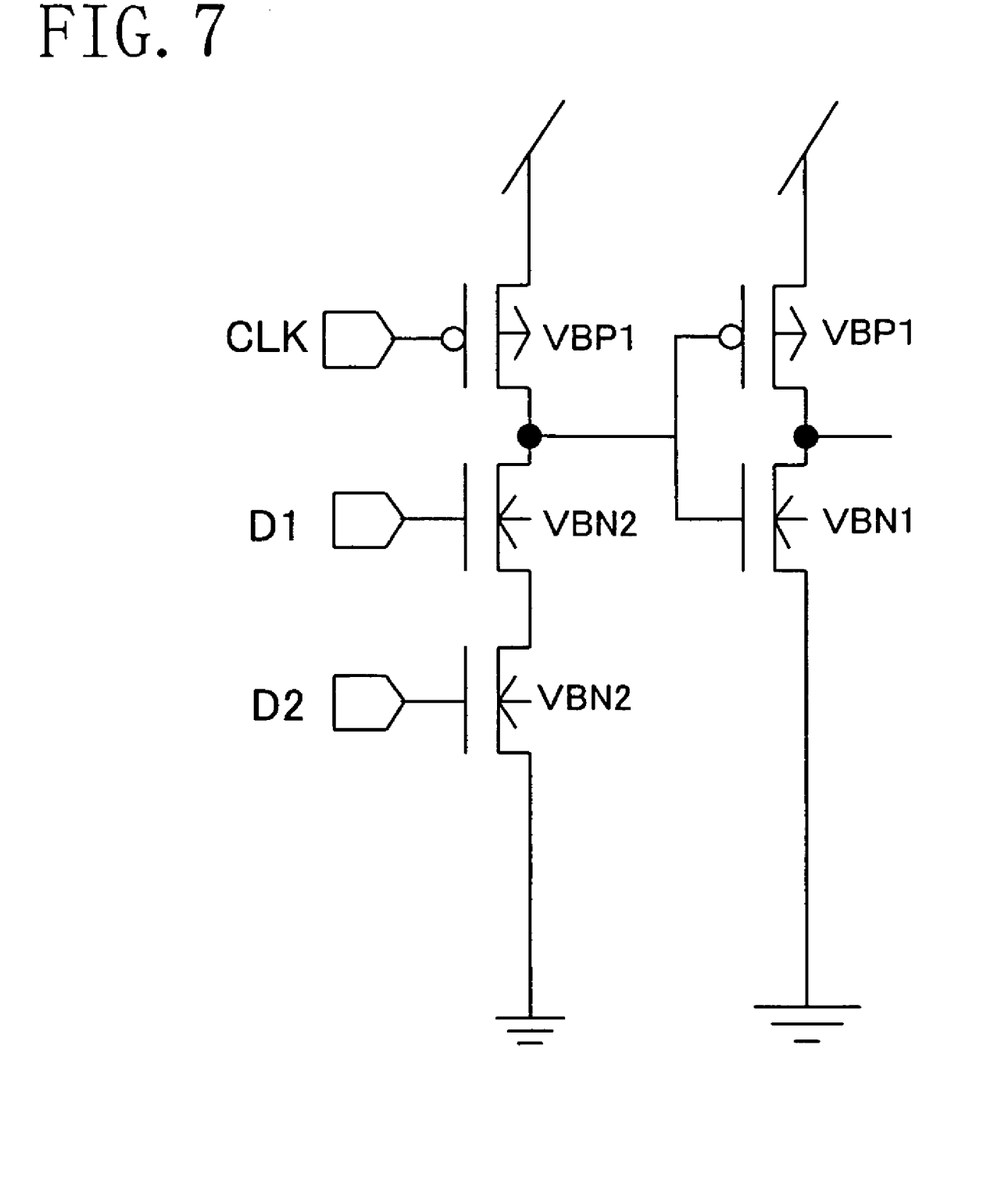
FIG. 7 is a view showing a structure of a dynamic circuit.
Figure 8:
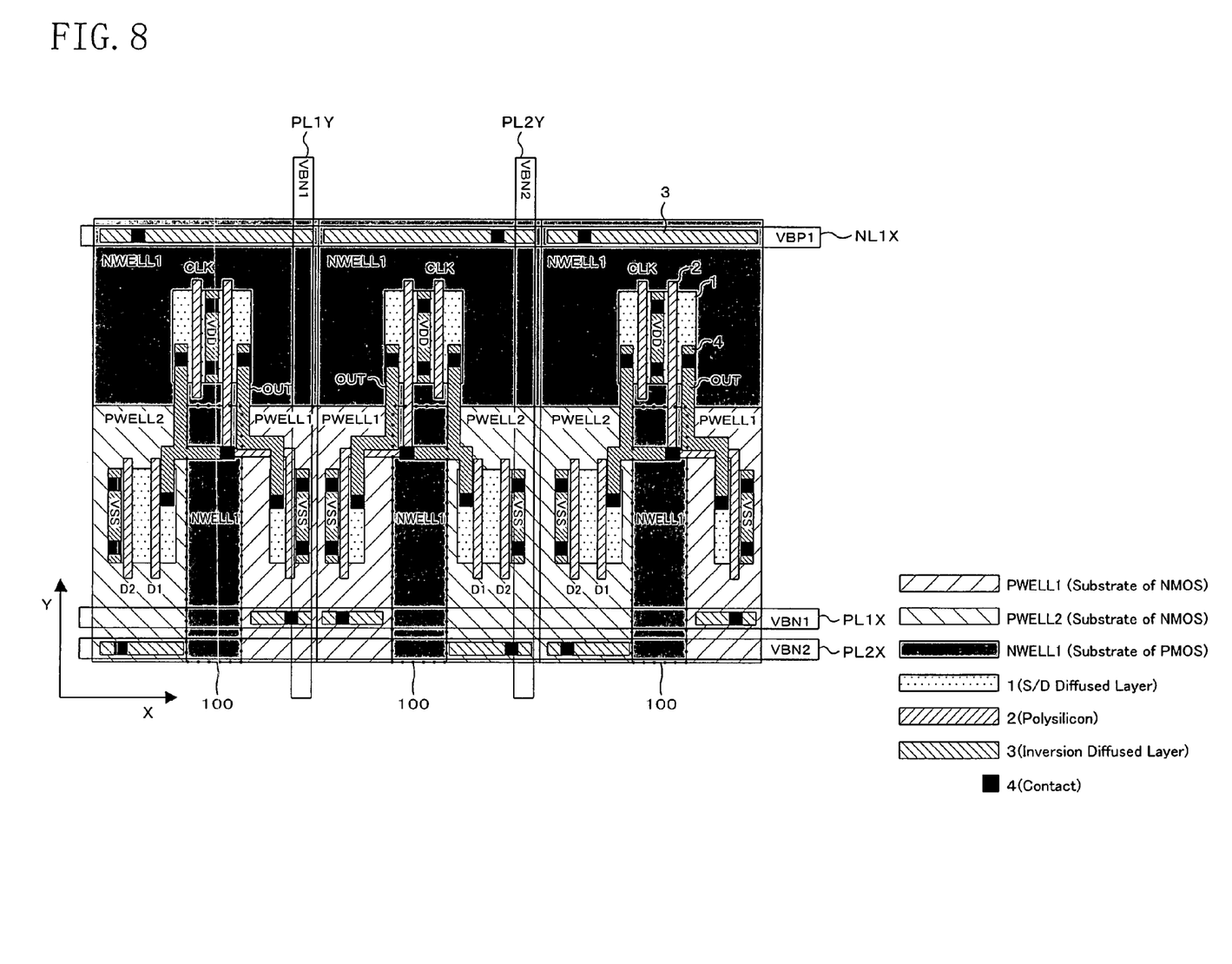
FIG. 8 is a conventional layout diagram.

One reason for this is that, in the current situation, it is difficult to ensure the stability of a specified circuit composing the semiconductor integrated circuit. In a dynamic circuit or domino circuit having a circuit structure in which an input signal is connected only to MOS transistors of one polarity, a voltage noise margin for the input signal is equal to the threshold of each of the MOS transistor. That is, when the threshold is scaled with the process, the input noise margin consequently lowers. For example, the noise margin of a 90-nm CMOS is about 300 mV at a room temperature (27° C.). As the temperature is higher, the threshold thereof particularly lowers so that the noise margin is about 100 mV at 125° C. When a consideration is given to variations in the power voltage (about 100 mV or more) of the semiconductor integrated circuit, there is substantially no noise margin and, in such a situation, a faulty operation may occur anytime. One approach to solving a problem as described above has been proposed recently. This is a method which gives a substrate potential in accordance with a circuit structure to bring the input noise margin to the same level at a room temperature and thereby maintains a high-speed property (see M. Sumita et al., "Mixed Body-Bias Techniques with fixed Vt and Ids Generation Circuits," ISSCC Dig. Tech. Papers, pp. 158-159, February 2004). In the approach, substrates having the same polarity and different substrate potentials are needed. FIG. 7 shows a dynamic circuit diagram proposed in the approach. In FIG. 7, each of D1 and D2 denotes input data, CLK denotes a clock signal, and OUT denotes an output from the dynamic circuit. The substrate voltages of individual MOS transistors are connected to VBN1, VBN2, and VBP1, of which the VBN1 and VBN2 are controlled to have different substrate potential characteristics. FIG. 8 shows a drawing obtained as a result of implementing the dynamic circuit of FIG. 7 in accordance with the conventionally proposed layout method (see Japanese Patent Publication No. 3212915). In FIG. 8, each of the elements comprises: NMOS substrates PWELL1 and PWELL2; a PMOS substrate NWELL; polysilicon 2 composing the respective gates of the MOS transistors; S/D diffused layers 1 forming the source/drain of each of the MOS transistors; an inversion diffused layer 3 for supplying a potential to each of the substrates; and contacts 4 providing connection between a first metal layer as the lowermost metal layer and each of the inversion diffused layer 3, the diffused layers 1, and the gates 2. Upper metal layers provided over the first metal layer are normally used for connection between the inputs and outputs of individual circuits, power sources, and substrate wiring, though the depiction thereof is omitted for the avoidance of complicated illustration. The inversion diffused layer 3 for supplying substrate potentials to the substrates PWELL1 and PWELL2 is connected to the metal layers (substrate potential supply lines PL1X, PL1Y, PL2X, and PL2Y) via the contacts 4. The potentials at the respective substrates PWELL1 and PWELL2 are independent of each other. As can be seen from the drawing, since the substrates PWELL1 and PWELL2 should not be conducted to each other, it is necessary to provide insulation therebetween by using the substrate NWELL1. When the dynamic circuit is physically placed, an overhead of the area occupied by the isolation region (region 100 enclosed in each of the broken rectangles in FIG. 8) has presented a problem.

SUMMARY OF THE INVENTION

The present invention has been achieved to solve the problem of the area overhead in the layout of the semiconductor integrated circuit mentioned above and it is therefore an object of the present invention to provide a semiconductor integrated circuit occupying a smaller area and free from the degradation of the circuit characteristics.

A semiconductor integrated circuit according to the present invention comprises: a first substrate of a first polarity to which a first substrate potential is given; a second substrate of the first polarity to which a second substrate potential different from the first substrate potential is given; and a third substrate of a second polarity different from the first polarity, wherein the first substrate is insulated from a power source or ground to which a source of a MOSFET formed on the substrate is connected, the third substrate is disposed between the first and second substrates in adjacent relation to the first and second substrates, and a circuit element is formed on the third substrate.

The arrangement allows a reduction in area overhead because the substrate of the second polarity that has been conventionally inserted between the two substrates each of the first polarity is no more necessary. As a result, it becomes possible to achieve a further area reduction and implement a high-performance semiconductor integrated circuit occupying a smaller area.

The semiconductor integrated circuit according to the present invention is extremely useful in implementing a high-performance semiconductor chip which is smaller in area and lower in power consumption, ensures a long battery lifetime with a future chip set supplied with power from a battery or the like, and can provide the chip set with a lower-cost and higher-performance semiconductor chip owing to the area reduction.

DESCRIPTION OF THE PREFERRED EMBODIMENTS

Referring to the drawings, the embodiments of the present invention will be described herein below in detail.

Embodiment 1

The first embodiment of the present invention shows an example of the placement of a semiconductor integrated circuit for supplying optimal substrate potentials to MOS transistors in a dynamic circuit.

Figure 1:
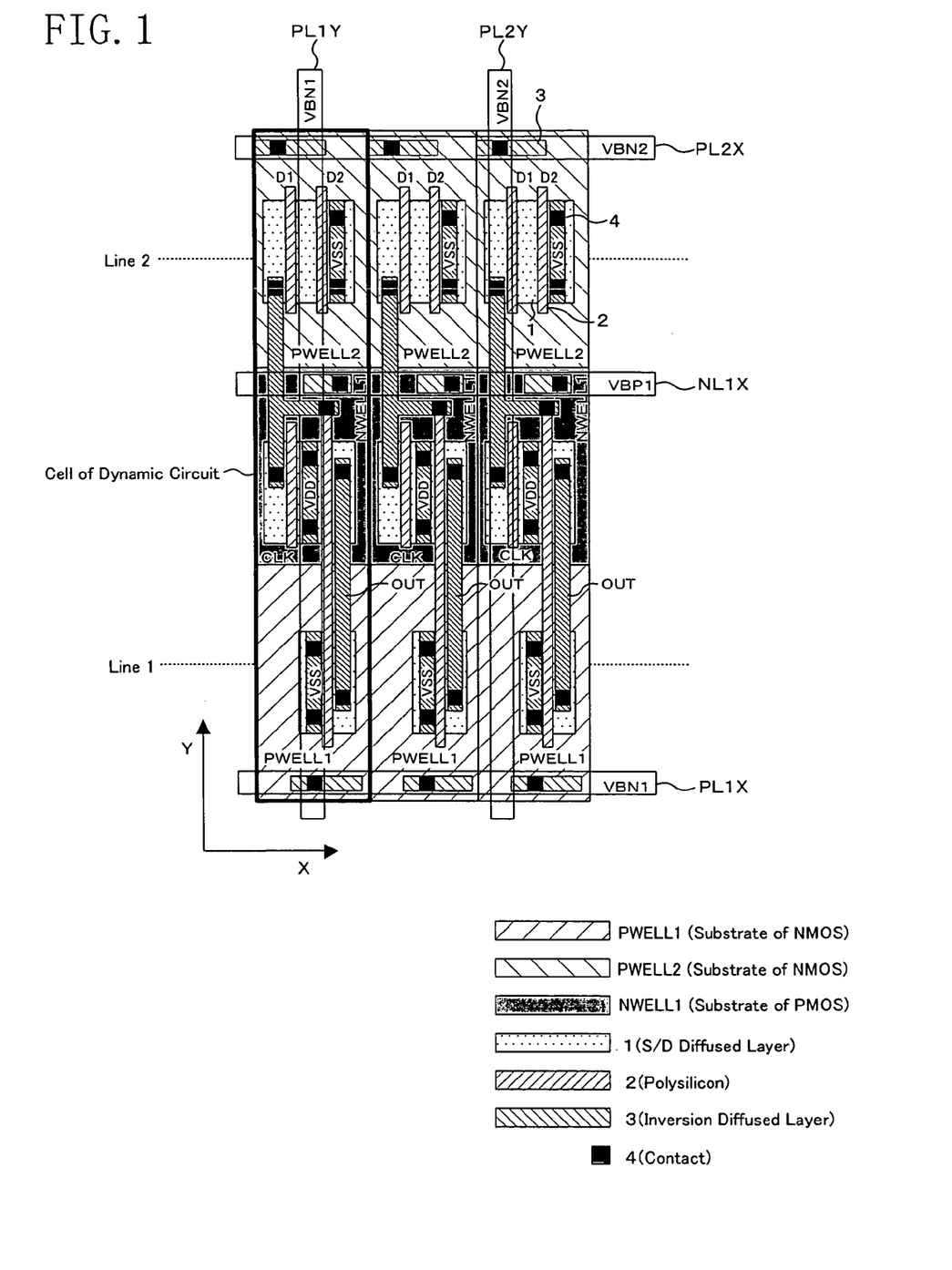
FIG. 1 is a layout diagram showing the basic structure of a semiconductor integrated circuit according to a first embodiment of the present invention.

FIG. 1 is a layout diagram in which the elements composing the dynamic circuit of FIG. 7 are physically arranged.

In FIG. 1, each of the elements comprises: NMOS substrates PWELL1 and PWELL2; a PMOS substrate NWELL1; polysilicon 2 composing the respective gates of the MOS transistors; S/D diffused layers 1 forming the source/drain of each of the MOS transistors; an inversion diffused layer 3 for supplying a potential to each of the substrates; and contacts 4 providing connection between a first metal layer as the lowermost metal layer and each of the inversion diffused layer 3, the diffused layers 1, and the gates 2. Upper metal layers provided over the first metal layer are normally used for connection between the inputs and outputs of individual circuits, power sources, and substrate wiring, though the depiction thereof is omitted for the avoidance of complicated illustration.

The inversion diffused layer 3 for supplying substrate potentials VBN1 and VBN2 to the substrates PWELL1 and PWELL2 is connected to the metal layers (substrate potential supply lines PL1X, PL1Y, PL2X, and PL2Y) via the contacts 4. The potentials at the respective substrates PWELL1 and PWELL2 are independent of each other. The substrate potentials VBN1 and VBN2 at the substrates PWELL1 and PWELL2 are supplied from a substrate-potential generation circuit (not shown). The NMOS transistor in the input portion of the dynamic circuit is disposed on the substrate PWELL2, while the NMOS transistor in the output portion of the dynamic circuit is disposed on the substrate PWELL1. Between the substrates PWELL1 and PWELL2, the PMOS substrate NWELL1 is disposed. In the structure of FIG. 1, the substrates PWELL2, NWELL1, and PWELL1 arranged in the Y-direction constitute one dynamic circuit cell. The cells (three cells are shown in FIG. 1) are repeatedly arranged in the X-direction. In the structure described above, the area overhead of the isolated region (the region 100 enclosed in each of the broken rectangles in FIG. 8), which is the problem encountered in the conventional embodiment, becomes zero so that an area reduction is achieved.

In contrast to the conventional structure in which the two transverse substrate potential supply lines (the substrate potential supply lines PL1X and PLX2) for the substrates PWELL1 and PWELL2 are arranged in parallel, the structure of FIG. 1 allows only one substrate potential supply line (which is the substrate potential supply line PL1X for the PWELL1 and the substrate potential supply line PL2X for the PWELL2) to suffice between the individual wells. Accordingly, when the layout in the transverse direction (X-direction in FIG. 1) is repeatedly placed in the longitudinal direction (Y-direction in FIG. 1), the overhead thereof is also eliminated so that a further area reduction is achieved.

In the conventional case where the substrate potential lines (the substrate potential supply lines PL1Y and PL2Y of FIG. 8) are arranged in the longitudinal direction (Y-direction), the overhead of longitudinal lines (lines in the Y-direction) for supplying the substrate potentials to the respective substrates PWELL1 and PWELL2 also exists. However, since the substrates PWELL on the same line in the transverse direction (X-direction) are at the same one potential (the potential at each of the substrates PWELL1 on the line 1 in the X-direction of FIG. 1 is VBN1 and the potential at each of the substrates PWELL2 on the line 2 is VBN2), i.e., since only one supply point is sufficient for the substrates PWELL on the same line in the transverse direction (X-direction), the overhead of the vertical lines (lines in the Y-direction) is also eliminated. Therefore, an area reduction is achieved.

The substrate potentials VBN1 and VBN2 of the substrates PWELL1 and PWELL2 will be described herein below in greater detail. As described in the conventional embodiment, to hold the noise margin of the dynamic circuit constant, such a substrate potential as to hold the threshold of the MOS transistor constant may be given appropriately. When a consideration is given to the substrate potential characteristic with regard to a temperature, it shows negative temperature dependence. To a MOS transistor such as an inverter, by contrast, such a substrate potential as to hold a saturation current constant may be given appropriately. When a consideration is given to the substrate potential characteristic with regard to the temperature, the characteristic has a gradient gentler than in the case where the substrate potential for holding the threshold constant is given or shows positive temperature dependence. Briefly, the substrate potential for holding the saturation current constant is higher at a higher temperature.

Figure 2A:
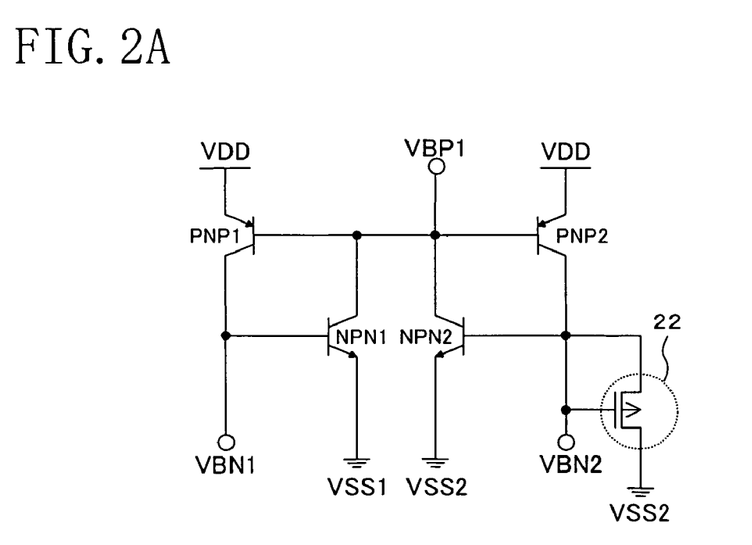
FIG. 2 are circuit diagrams each showing a parasitic bipolar structure.
Figure 2B:
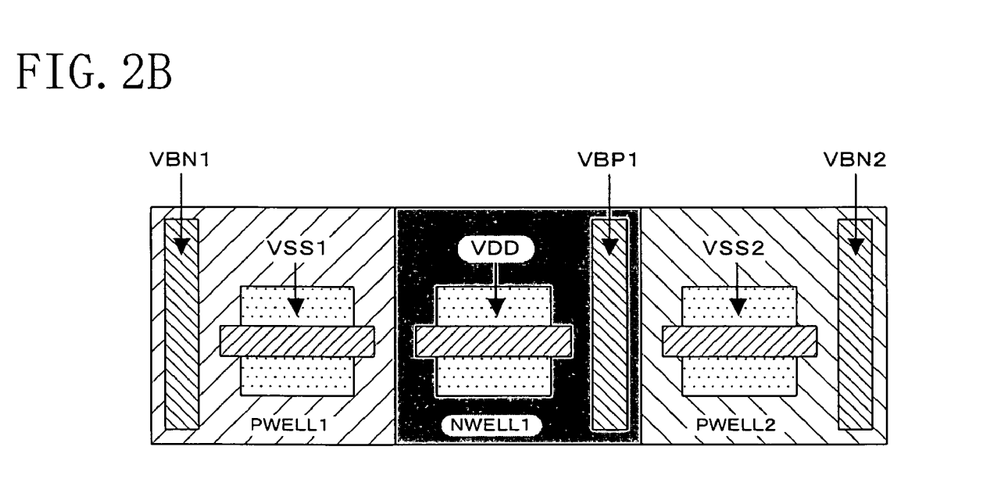

When the substrate potential for holding the saturation current constant is higher than the source potential of the MOS transistor at a high temperature, a parasitic bipolar structure as shown in FIG. 2 may cause a latch-up. To reduce the parasitic resistance of the base of the PNP bipolar structure for the prevention of the latch-up, the inversion diffused layer 3 on the substrate NWELL1 is preferably brought closer to the one of the substrates PWELL1 and PWELL2 which is higher in substrate potential. The description will be given herein below on the assumption that VBN1<VBN2 is satisfied. In this case, the inversion diffused layer 3 on the substrate NWELL1 is preferably brought closer to the substrate PWELL2. In other words, the possibility of the latch-up resulting from the parasitic bipolar structure between the substrates PWELL1 and NWELL1 is extremely low so that, to further improve the area efficiency of the layout, it is sufficient to place the inversion diffusion layer 3 provided on the substrate NWELL1 only between the substrates PWELL2 and NWELL1.

The same shall apply to the case where a protective circuit 22 shown in FIG. 2 is used for the latch-up prevention. To further improve the area efficiency of the layout, it is sufficient to provide the protective circuit 22 only between the substrates PWELL2 and NWELL1.

The same effects are achievable not only by a dynamic circuit as shown in FIG. 1 but also by a circuit formed of a high-resistance element which is provided on the NWELL1 in place of the PMOS transistor. The high-resistance element is implemented by using the polysilicon 2 or the diffused layer 1.

When the respective gates oxide films of the MOS transistor formed on the substrate PWELL1 and the MOS transistor formed on the substrate PWELL2 have different thicknesses or are made of different materials, a structure in which the number of series-connected MOS transistors is large is adopted. In other words, a MOS transistor with a large gate leakage current is selected as each of the MOS transistors formed on the substrate PWELL2. When the MOS transistor formed on the substrate PWELL1 and the MOS transistor formed on the substrate PWELL2 have different thresholds, a structure in which the number of series-connected MOS transistors is large is adopted. In other words, a MOS transistor with a large drain leakage current (having a low threshold) is selected as each of the MOS transistors formed on the substrate PWELL2. The arrangement allows a leakage current reduction in each of the MOS transistors and thereby allows a further reduction in power consumption.

In addition, by individually controlling the respective potentials supplied to the MOS transistor on the substrate PWELL1 and the MOS transistor on the substrate PWELL2 (for example, by individually controlling the potential VSS1 supplied to the MOS transistor on the substrate PWELL1 and the potential VSS2 supplied to the MOS transistor on the substrate PWELL2, as shown in FIG. 2), the power consumption can be further reduced. In this case, when the lines for supplying the potentials are arranged in the transverse direction (X-direction) in the conventional embodiment, the supply lines that can be implemented are only thin lines having extremely small widths. In the layout according to the present invention, by contrast, the supply lines can have sufficiently large widths and prevent a voltage drop due to a parasitic resistance.

Embodiment 2

Figure 3:
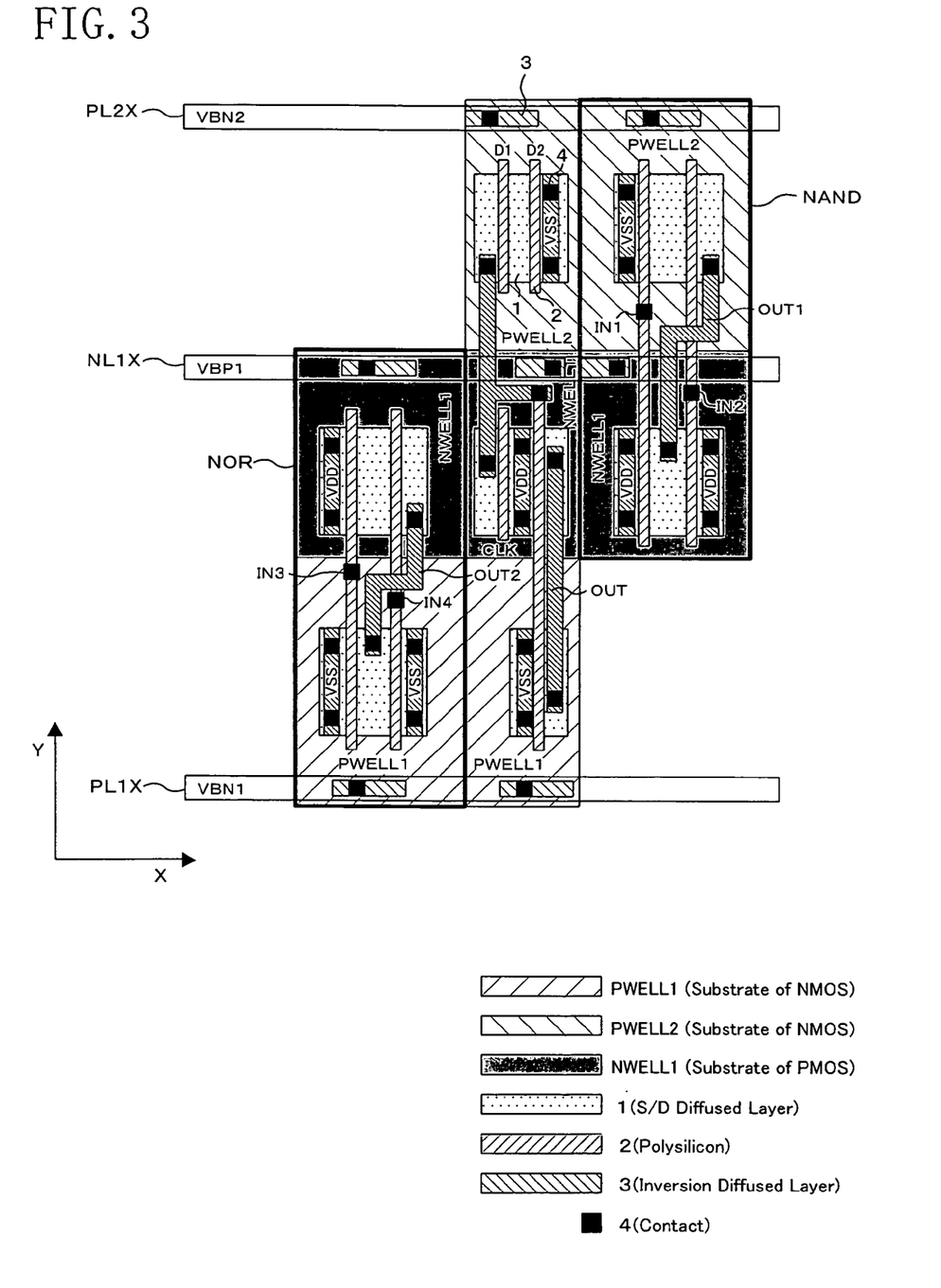
FIG. 3 is a layout diagram showing the basic structure of a semiconductor integrated circuit according to a second embodiment of the present invention.

The first embodiment has described the case where the dynamic circuits are repeatedly arranged. The second embodiment will describe the case where the dynamic circuit is mounted together with another logic circuit on one chip. FIG. 3 shows a layout structure of the basic structure of the second embodiment. The structure of FIG. 3 is obtained when a 2-input NAND circuit is placed on the right side of the dynamic circuit and a 2-input NOR circuit is placed on the left side thereof. When the number of series-connected NMOS transistors is large, they are disposed on the substrate PWELL2. Conversely, when the number of series-connected NMOS transistors is small, they are disposed on the substrate PWELL1. As the number of series-connected MOS transistors is larger, a drain leakage current is reduced under the DIBL (Drain Induced Barrier Lowering) effect. When the number of series-connected MOS transistors is two, the drain leakage current is about 25% of that when there are no series-connected MOS transistors. When the number of series-connected MOS transistors is three, the drain leakage current is about 10% of that when there are no series-connected MOS transistors. Thus, unlike the saturation current (the saturation current when the number of series-connected MOS transistors is two is about 50% of that when there are no series-connected MOS transistors and the saturation current when the number of series-connected MOS transistors is three is about 10% of that when there are no series-connected MOS transistors), the leakage current undergoes a drastic reducing effect achieved thereon. In other words, even when the substrate potential VBN2 of the substrate PWELL2 which is large in the number of series-connected MOS transistors is increased to a value higher than the substrate potential VBN1 of the substrate PWELL1 to improve the saturation current of each of the MOS transistors, the leakage current does not remarkably increase compared with the case where the substrate potential is uniquely varied as in the conventional embodiment. In short, the area occupied by each of the MOS transistors on the substrate PWELL2 can be reduced since the width and length of the MOS transistor can be set on the assumption that the substrate potential for improving the saturation current is given. For example, in the case where a substrate potential of 0.4 V is applied to the substrate PWELL2, when the saturation current of the transistor improves by 1.5 times the original value, a transistor width of 66% of that of the conventional embodiment can be implemented.

Embodiment 3

Figure 4:
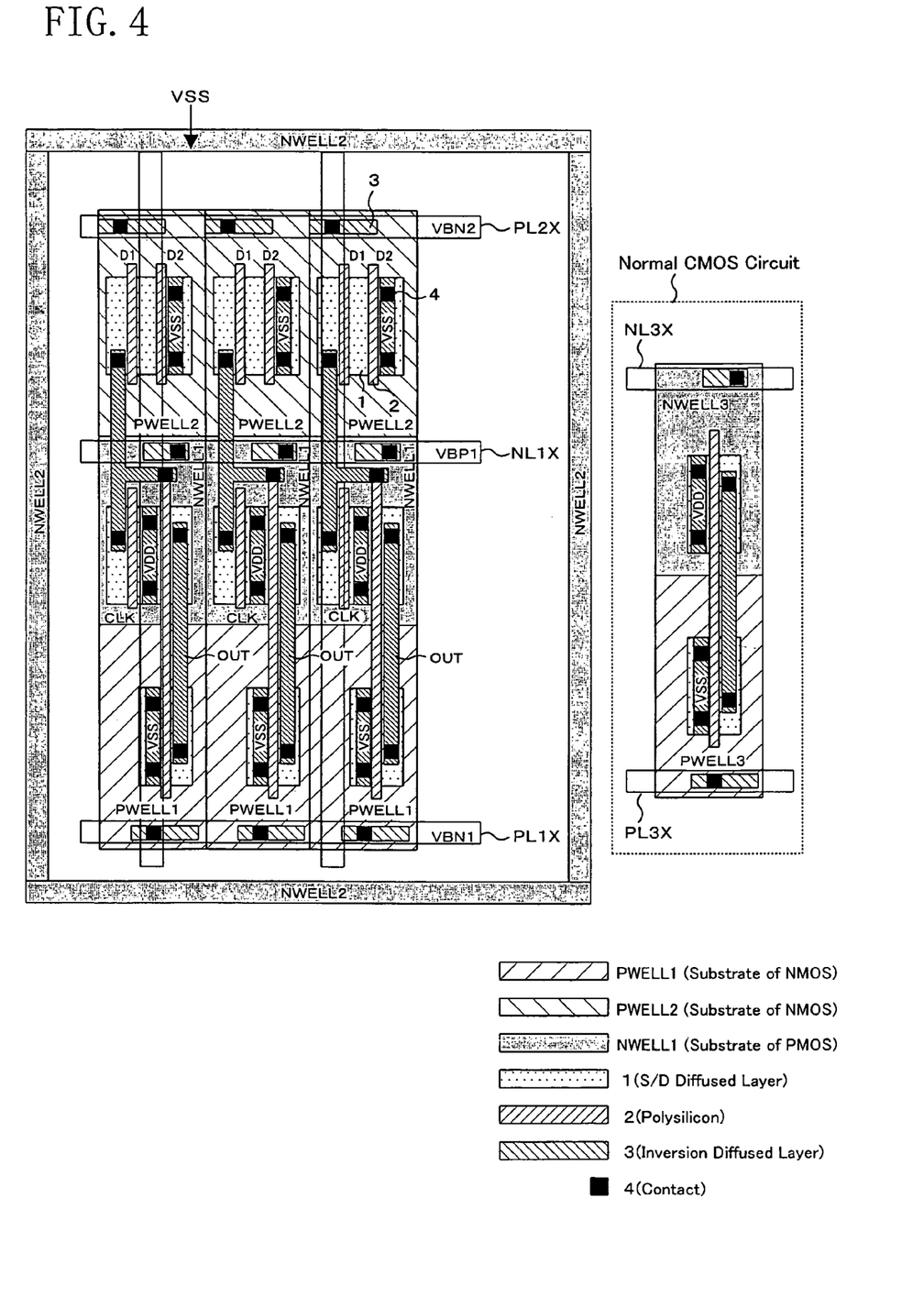
FIG. 4 is a layout diagram showing the basic structure of a semiconductor integrated circuit according to a third embodiment of the present invention.
Figure 5:
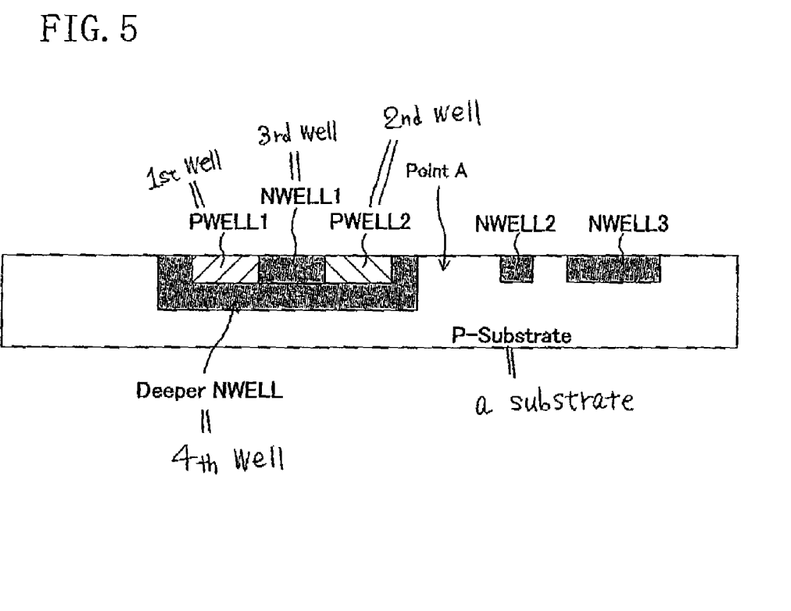
FIG. 5 is a cross-sectional view of the semiconductor integrated circuit shown in FIG. 4.

FIG. 4 shows a layout structure of a semiconductor integrated circuit according to the third embodiment of the present invention. FIG. 5 is a cross-sectional view thereof. In the structure of FIG. 4, a normal CMOS circuit exists on a lateral side of the physically placed semiconductor integrated circuit of FIG. 1 such that the semiconductor integrated circuit of FIG. 1 is surrounded by the substrate NWELL2, whereby the substrate NWELL2 is grounded. By thus disposing the substrate NWELL2 between the substrate NWELL1 and a substrate NWELL3, a latch-up can be prevented.

Figure 6A:
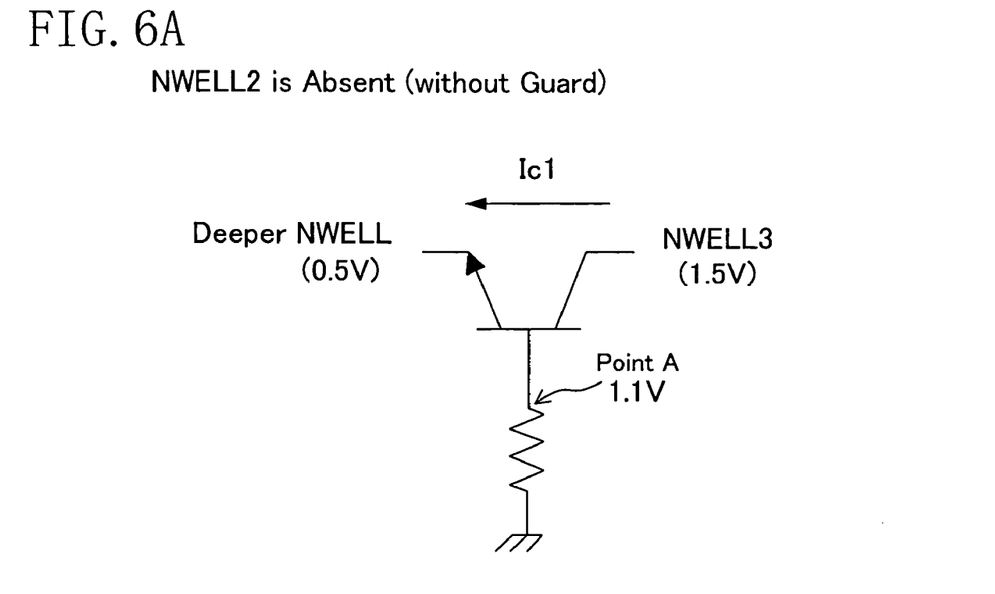
FIG. 6 are views for illustrating the effect of the semiconductor integrated circuit shown in FIG. 4.

For example, in the case where the substrate NWELL2 is not provided, when the potential at the point A between the deeper substrate NWELL of a P-substrate and the substrate NWELL3, which should originally be 0 V, has reached, e.g., 1.1 V due to a high resistance as shown in FIG. 6(a), a current Ic1 flows from the substrate NWELL3 to the deeper substrate NWELL. As a result, the voltage of the substrate NWELL1 increases.

Figure 6B:
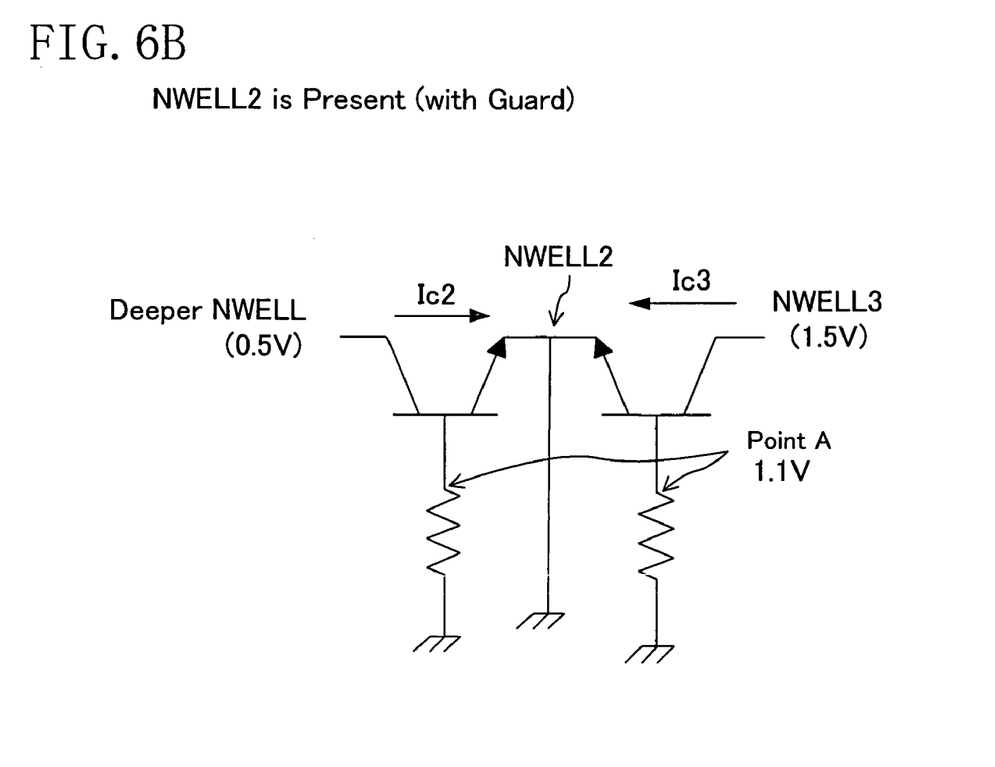

By contrast, in the case where the substrate NWELL2 is provided, the current Ic1 flowing from the substrate NWELL3 to the deeper substrate NWELL is reduced, as shown in FIG. 6(b). A current Ic3 flows from the substrate NWELL3 to the substrate NWELL2 and an extremely small current Ic2 flows from the deeper substrate NWELL to the substrate NWELL2. This prevents an increase in the voltage of the substrate NWELL1, allows a stable potential to be retained at the substrate NWELL1, and stabilizes the operation of the MOS transistors.

The same effects are also achievable when the semiconductor integrated circuit of FIG. 1 is surrounded by the substrate PWELL, not by the substrate NWELL, and the substrate PWELL is grounded at VSS. The reason for this is that a high resistance is less likely to develop between the point A and the P-substrate and the potential at the point A is in the vicinity of 0 V.

What is claimed is:

1. A semiconductor integrated circuit comprising:
   a substrate;
   a first well of a first polarity to which a first potential is given;
   a second well of the first polarity to which a second potential different from the first potential is given;
   a third well of a second polarity different from the first polarity;
   a fourth well of the second polarity, which is above the substrate; and
   a circuit element on the third well, wherein
   the first well is insulated from a power source or ground to which a source of a MOSFET formed on the first well is connected,
   the third well is disposed between the first and second wells in adjacent relation to the first and second wells, and
   the first well, the second well and the third well are above the fourth well.

2. The semiconductor integrated circuit of claim 1, wherein the circuit element is a MOSFET.

3. The semiconductor integrated circuit of claim 1, wherein the circuit element is a high-resistance load element.

4. The semiconductor integrated circuit of claim 3, wherein the high-resistance load element is formed of polysilicon or a diffused layer.

5. The semiconductor integrated circuit of claim 1, wherein the second well is isolated from a power source or ground to which a source of a MOSFET formed on the second well is connected.

6. The semiconductor integrated circuit of claim 1, wherein the third well is isolated from a power source or ground to which a source of a MOSFET formed on the third well is connected.

7. The semiconductor integrated circuit of claim 1, wherein the first to third wells have respective MOSFETs provided thereon and the first to third wells form one cell.

8. The semiconductor integrated circuit of claim 1, wherein each of the first and second potentials is supplied from a potential generation circuit.

9. The semiconductor integrated circuit of claim 1, wherein the MOSFET formed on the first well and a MOSFET formed on the second well have different thresholds.

10. The semiconductor integrated circuit of claim 1, wherein a gate oxide film of the MOSFET formed on the first well and a gate oxide film of a MOSFET formed on the second well have different thicknesses.

11. The semiconductor integrated circuit of claim 1, wherein a gate oxide film of the MOSFET formed on the first well and a gate oxide film of a MOSFET formed on the second well are made of different materials.

12. The semiconductor integrated circuit of claim 1, further comprising:
    a potential supply line for supplying the first potential, wherein
    the potential supply line is provided on the first well and extending in a direction parallel with a longer edge of the first well.

13. The semiconductor integrated circuit of claim 1, further comprising:
    a potential supply line for supplying the second potential, wherein
    the potential supply line is provided on the second well and extending in a direction parallel with a longer edge of the second well.

14. The semiconductor integrated circuit of claim 1, further comprising:
    a potential supply line for supplying the first potential, wherein
    the potential supply line is provided on the first well and extending in a direction parallel with a shorter edge of the first well.

15. The semiconductor integrated circuit of claim 1, further comprising:
    a potential supply line for supplying the second potential, wherein
    the potential supply line is provided on the second well and extending in a direction parallel with a shorter edge of the second well.

16. The semiconductor integrated circuit of claim 1, wherein the power source or ground line to which the source of the MOSFET formed on the first well is connected is different from a power source or a ground line to which a source of a MOSFET formed on the second well is connected.

17. The semiconductor integrated circuit of claim 1, wherein
    an inversion diffused layer for supplying a potential to the third well is provided on the third well and
    the inversion diffused layer is provided in a vicinity of the first well or the second well.

18. The semiconductor integrated circuit of claim 17, wherein the inversion diffused layer is provided in the vicinity of the one of the first and second wells to which the higher potential is given.

19. The semiconductor integrated circuit of claim 1, wherein a first MOSFET is formed on either one of the first and second wells and the first MOSFET has a gate and a drain each connected to the one of the first and second wells.

20. The semiconductor integrated circuit of claim 19, wherein the first MOSFET is formed on the one of the first and second wells to which the higher potential is given.

21. The semiconductor integrated circuit of claim 1, further comprising:
    a fourth well surrounding a periphery of the second well, wherein
    the fourth well is connected to a ground line.

22. The semiconductor integrated circuit of claim 7, further comprising:
    a clock signal line;
    a data input signal line; and
    first and second signal lines, wherein
    the MOSFET on the third well pre-charges the first signal line in response to a clock signal from the clock signal line, the MOSFET on the first well discharges the first signal line in response to a data input signal from the data input signal line, and the MOSFET on the second well discharges the second signal line in response to an output from the first signal line.

23. The semiconductor integrated circuit of claim 1, wherein two or more series-connected MOSFETs, each for discharging a signal line, are formed on the second well and a potential supply line or an inversion diffused layer each for supplying a potential to the third well is closer to the second well than to the wells of the first polarity other than the second well.

24. The semiconductor integrated circuit of claim 11, wherein a MOSFET for discharging a first signal line in response to a clock signal is formed on the first well and two or more series-connected MOSFETs, each for discharging a second signal line, are formed on the second well.

25. The semiconductor integrated circuit of claim 12, wherein a MOSFET for discharging a first signal in response to a clock signal is formed on the first well and two or more series-connected MOSFETs, each for discharging a second signal line, are formed on the second well.

26. The semiconductor integrated circuit of claim 1, wherein a MOSPET for discharging a signal line in response to a clock signal is formed on either of the first and second wells of the first polarity and a potential at the well formed with the MOSFET has negative temperature dependence.

27. The semiconductor integrated circuit of claim 11, wherein a MOSFET for discharging a signal line in response to a clock signal is formed on either of the first and second wells of the first polarity and a potential at the well formed with the MOSFET has negative temperature dependence.

28. The semiconductor integrated circuit of claim 1, further comprising:

a NAND circuit and a NOR circuit which are implemented with CMOS logic, wherein

NMOS transistors constituting the NOR circuit are formed on the first well and

NMOS transistors constituting the NAND circuit are formed on the second well.

29. The semiconductor integrated circuit of claim 1, wherein a circuit in which NMOS transistors are connected in parallel is formed on the first well and a circuit in which NMOS transistors are connected in series is formed on the second well.

* * * * *